United States Patent [19]

Sander et al.

[11] 4,434,477
[45] Feb. 28, 1984

[54] MECHANICALLY ADDRESSED OPTICAL MEMORY

[75] Inventors: Ingolf Sander; Bernhard Hill, both of Hamburg, Fed. Rep. of Germany

[73] Assignee: U.S. Philips Corporation, New York, N.Y.

[21] Appl. No.: 93,335

[22] Filed: Nov. 13, 1979

Related U.S. Application Data

[63] Continuation of Ser. No. 883,497, Mar. 6, 1978.

[30] Foreign Application Priority Data

Mar. 9, 1977 [DE] Fed. Rep. of Germany ..... 2710166

[51] Int. Cl.³ .............................................. G11C 13/04
[52] U.S. Cl. .................................... 365/120; 365/124; 365/127
[58] Field of Search ..................... 365/120, 127, 124

[56] References Cited

U.S. PATENT DOCUMENTS

| | | | |
|---|---|---|---|
| 2,605,965 | 8/1952 | Shepherd | 365/120 |
| 2,907,997 | 10/1959 | Corwin et al. | 365/120 |
| 3,072,889 | 1/1963 | Willcox | 365/127 |
| 3,638,185 | 1/1972 | Dell et al. | 365/127 |
| 3,654,624 | 4/1972 | Becker et al. | 365/127 |
| 3,806,643 | 4/1974 | Russell | 365/127 |
| 3,848,095 | 11/1974 | Wohlmut et al. | 365/120 |
| 3,919,697 | 11/1975 | Walker | 365/120 |
| 3,946,166 | 3/1976 | Wossidlo | 365/120 |
| 4,074,085 | 2/1978 | Russell | 365/120 |
| 4,163,290 | 7/1979 | Sutherlin et al. | 365/120 |

*Primary Examiner*—Terrell W. Fears
*Attorney, Agent, or Firm*—Thomas A. Briody; Robert T. Mayer; Algy Tamoshunas

[57] ABSTRACT

An optical memory with a storage plate and an optical write/read unit, with which during a relative movement the storage plate is illuminated pointwise for writing and reading of information, the storage plate and the optical write/read unit each being positioned in a coordinate with the aid of electromagnetic mechanical positioning means for addressing storage elements.

31 Claims, 13 Drawing Figures

MECHANICALLY ADDRESSED OPTICAL MEMORY

This is a continuation of application Ser. No. 883,497, filed Mar. 6, 1978.

The invention relates to an optical memory with a storage plate and an optical write/read unit, by means of which in a relative movement the storage plate is illuminated pointwise during writing and reading of information.

Optical memory systems utilizing the high storage density achievable with optical methods are already known. In principle, these memories may be divided into three classes:
1. holographic memories;
2. memories with pointwise storage and addressing by means of non-mechanical light deflectors;
3. memories with pointwise storage and mechanical addressing.

Holographic memories, as known from "I.E.E.E. Spectr.", Feb. 25, 1973 and "Applied Optics", 11, 2133 (1972), in principle have advantages such as, for example, a comparatively high storage capacity in the case of three-dimensional storage. However, until now a practical application could not be realized for lack of an appropriate erasable holographic storage material.

Erasable magneto-optical storage materials are now available for memories with localized storage. Non-mechanically addressed systems using light-deflector techniques are also known, see "Applied Optics", November 1975. Non-mechanical addressing enables random access with short access times, which cannot be realized with mechanical systems. However, the special techniques necessary for this are very intricate, so that use of such memories is economically practical only for larger computer systems.

Mechanically addressed optical memories are also known, but they are very complicated and are generally based on the use of a non-erasable storage material.

An erasable memory using manganese-bismuth as storage material and a system with a rotary storage disk has also been described in "Applied Optics", October 1972.

Memory systems with rotary disks in principle have four disadvantages:
1. The central part of the disk cannot be utilized.
2. In order to avoid a highly intricate electronic system, storage with maximum bit density is effected only on the innermost track. In the case of a constant number of bits per track the maximum attainable bit density is not utilized on the outer tracks.
3. In principle the minimum attainable access time is determined by the time needed for one revolution.
4. Only sequential access is possible.

It is the object of the invention to provide an optical memory of the type mentioned in the preamble, which by simple means enables accurate positioning for small areas to be obtained, so as to benefit from the very high bit density inherently possible with optical storage materials. This makes it possible to obtain comparatively high storage capacities while requiring only a small surface area.

In accordance with the invention this is achieved in that the storage plate, that is the planar memory, and the optical write/read unit for addressing specific storage locations are each positioned in a given coordinate with the aid of electromagnetic mechanical positioning means.

Since the maximum distances traversed during positioning are short, access times in the msec. ragne are obtained and in comparison, less stringent requirements have to be imposed on the mechanical properties of the system. Positioning systems which are preferably used are loud-speaker systems. For random positioning both in the x and in the y-direction there may be provided a control circuit, which employs the address as the desired value.

There may also be provided a plurality of write/read units with a common light source whose light is distributed by a beam-splitting device comprised of semi-transparent mirrors or birefringent calcite prisms. It is also possible to use beam-splittnig holograms (point holograms) or optical fibre guides for the distribution of the light.

A very satisfactory storage material is magneto-optical material, such as for example an iron garnet layer or a manganese-bismuth layer, which is arranged between substantially crossed polarisation sheets. A magneto-optical photoconductor sandwich (MOPS) is also particularly a storage material, as well as non-erasable thin metal films or photographic layers.

Random positioning in the x-direction is also possible while the storage plate is periodically moved to and fro in the y-direction. To obtain a very high storage density, the memory plate can be moved to and fro periodically in the y-direction and the information can be stored on the memory disk along information tracks in the y-direction, which tracks include guide segments used for optically measuring the movement in the x-direction so that the x-position can be accordingly corrected.

In the case of storage capacities of the order of $10^6$–$10^8$ bits, such as those required for intermediate and small-scale data processing systems, this makes it possible to construct particularly simple and cheap memories with comparatively small overall volume.

The invention will be described in more detail with reference to the accompanying drawing, in which.

Figures 1, 2, 3A:
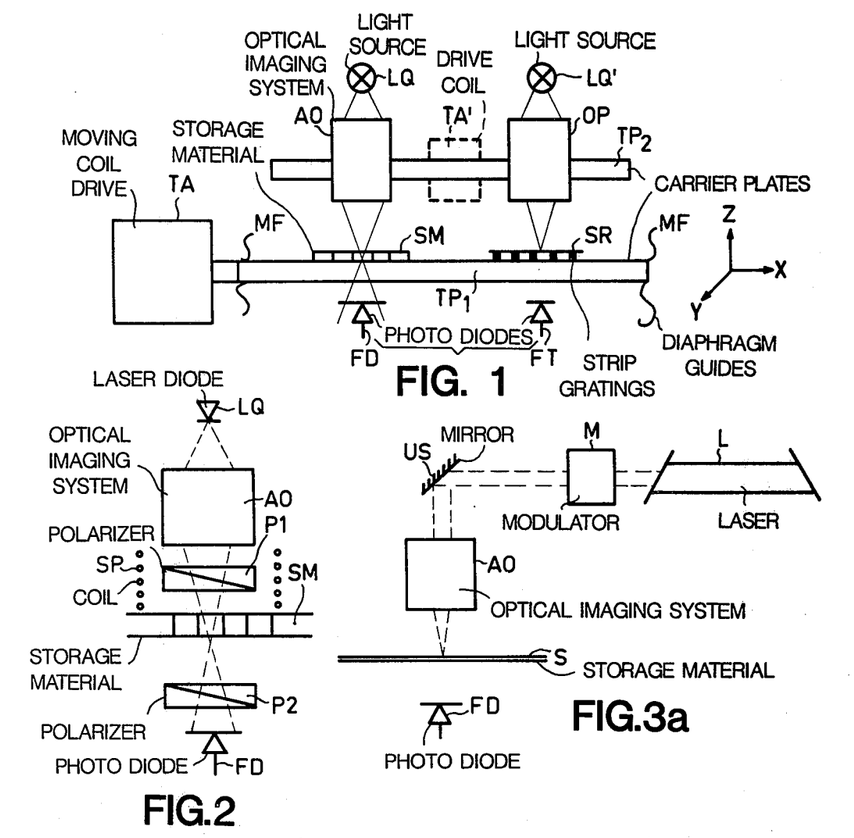
FIG. 1 schematically shows a construction in accordance with the invention using the principle of the magneto-mechanically addressed optical memory.
FIG. 2 shows a write/read unit with a semi-conductor laser diode.
FIG. 3a shows a write/read unit for reading in transmission.

In accordance with FIG. 1 magneto-mechanical xy-positioning of the optical memory is effected by means of a moving-coil drive.

A carrier plate TP1 is mounted for rectilinear movement in the x-direction by means of diaphragm guides MF, roller or plain bearings. With the aid of a moving-coil drive TA, for example that of a loudspeaker system, the carrier plate TP1 can be positioned in the x-direction. The storage material SM is permanently or interchangeably arranged on this carrier plate. Preferably, the storage material consists of a magneto-optic material. For non-erasable storage layers it is alternatively possible to employ thin metal films or photographic layers.

A second carrier plate TP2, which is movable in the y-direction normal to the direction of movement of the first plate and which can also be positioned with the aid of a moving-coil drive TA', accommodate the components necessary for writing or reading, such as the light sources LQ and LQ', the optical imaging system AO, and the photodiodes, in the case of operation in the reflection mode. Otherwise, the photodiodes FD and FT may be mounted so as to be spatially stationary.

By suitably positioning the two carrier plates, the write/read unit can be passed over any point of on the storage material for locally writing or reading information. Operation of the memory is possible with random access to the individual data bits, or with row and column scanning either in the start-stop mode or, in order to obtain a high data rate, in the scan mode in which the write/read system is moved with a uniform speed relative to the storage plate. In addition to the storage material, the carrier plate TP1 accommodates two strip gratings SR which are perpendicular to each other and whose grating periods correspond to the distance between the storage locations on the storage material. The strip gratings are scanned by photoelectric cells and the distance covered in the x and y-direction, and thus the exact position, is derived from the number of brightness variations during the relative movement of the strip grating and photoelectric cell. In the case of an externally applied address of a desired position, a control signal can be derived from the difference between the desired and the actual position, and the control signal then drives the x, y moving coil drives TA and TA' in such a way that the desired address is reached.

The storage capacity and data rate can be increased by parallel operation, employing a plurality of storage plates and/or a plurality of write/read systems, without the access time being prolonged and the mechanical construction being significantly complicated.

FIG. 2 shows a corresponding basic unit of a write/read system. The radiation from the laser diode LQ is focussed on the storge material SM by the optical imaging system AO and heats the selected storage cell during the write operation. The magnetization of the selected storage cell is changed by the application of an external magnetic field with the aid of the coil SP in accordance with the direction of magnetization assigned to the bit value to be written.

For reading, the light is linearly polarized by the polarizer P1 before impinging onto the storage layer. The light intensity behind the polarizer P2, the polarization direction of which is substantially normal to that of the polarizer P1, depends on the stored information owing to the rotation of the plane of polarization of the light in the storage layer which varies with the condition of magnetisation. An electric read signal is available across the photodiode FD.

Figure 3B:
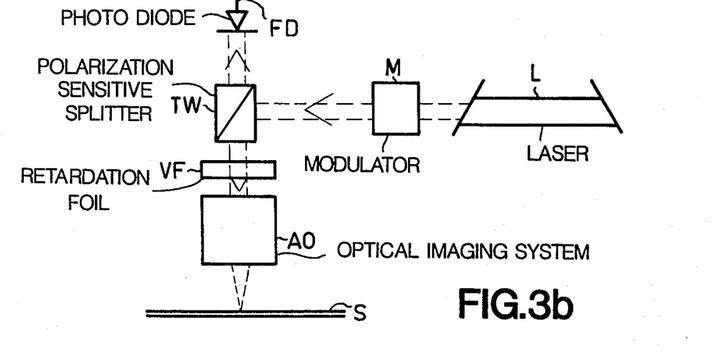
FIG. 3b shows a unit for reading in reflection.

FIG. 3a shows the basic unit of a write/read system. The radiation from the laser L is transmitted or suppressed by the modulator M for writing and is switched to a reduced intensity for reading. The optical imaging system AO focusses the radiation onto the storage layer S. The deflection mirror US, which is coupled to the optical system AO, enables the optical imaging system to be shifted laterally in the case of a stationary laser L and modulator M. Reading is effected at reduced light intensity with the aid of the photodiode FD in transmission or in the embodiment of FIG. 3b in reflection, the polarization sensitive splitter cube TW, in conjunction with a retardation foil VF separating the incident and reflected light.

For positioning and addressing purposes access to the various bits on the storage surface is effected by mechanically moving the storage plate relative to the optical components. For addressing purposes the exact position of the light beam on the storage surface should be determined by means of a suitable system.

Figure 4:
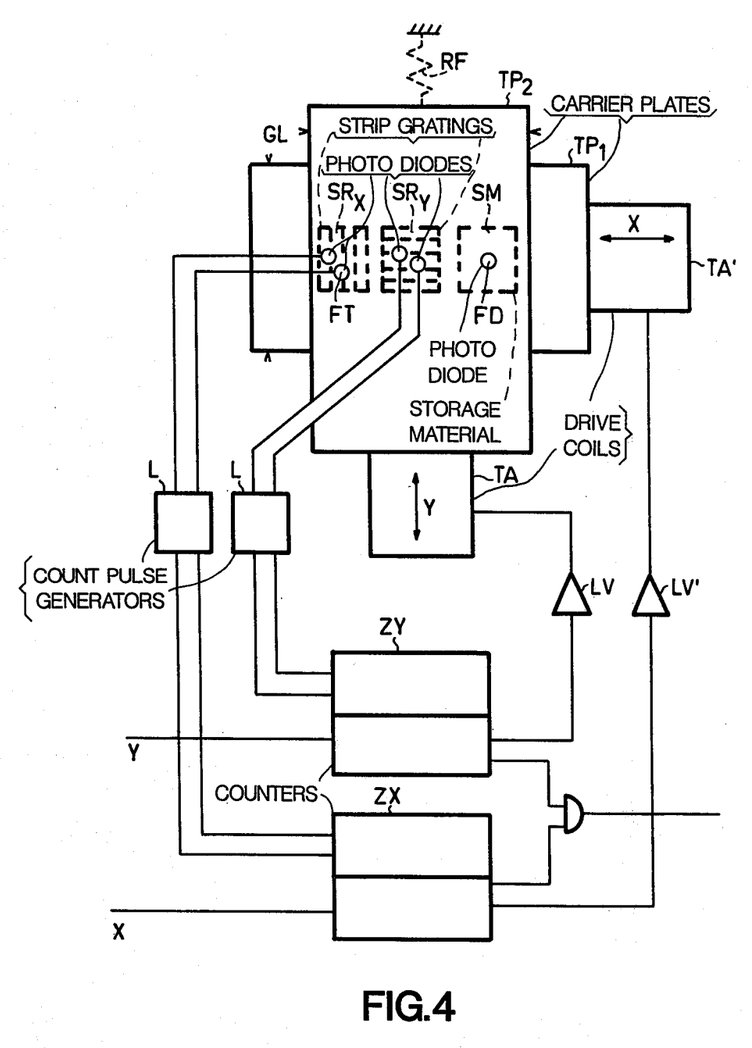
FIG. 4 represents the electronic positioning device in block-schematic form.

In accordance with FIG. 4 the storage material SM on the carrier plate TP1 is positioned in the x-direction and the optical components of the write/read system on the carrier plate TP2 in the y-direction. The two plates are driven by moving-coil systems TA and TA' and supported by diaphragm guides or roller or plain bearings GL. In order to determine the positions of the carrier plates relative to each other, the carrier plate TP1, moreover, accommodates two strip gratings $SR_x$ and $SR_y$ which are perpendicular to each other and whose grating pitch corresponds to the pitch of the storage cells. By means of photo-electric cells (FIG. 1) consisting of a light source LQ', an optical system O, and photodiodes FD, the displacements of the gratings are detected when TP1 moves relative to TP2. The brightness changes are counted by the counter ZX and ZY and thus the exact positions are determined. Since the movements in the x and the y-direction can be either forward or backward, the counting direction for the counters should be switched accordingly. This is effected in that the photo-electric cells have been duplicated at a distance of a quarter grating period. Thus, the movement results in a sine and a cosine signal, so that with the aid of the logic circuit LG and LG' the movement in the x and y-direction can be derived from the position of said signals relative to each other.

Figure 7A:
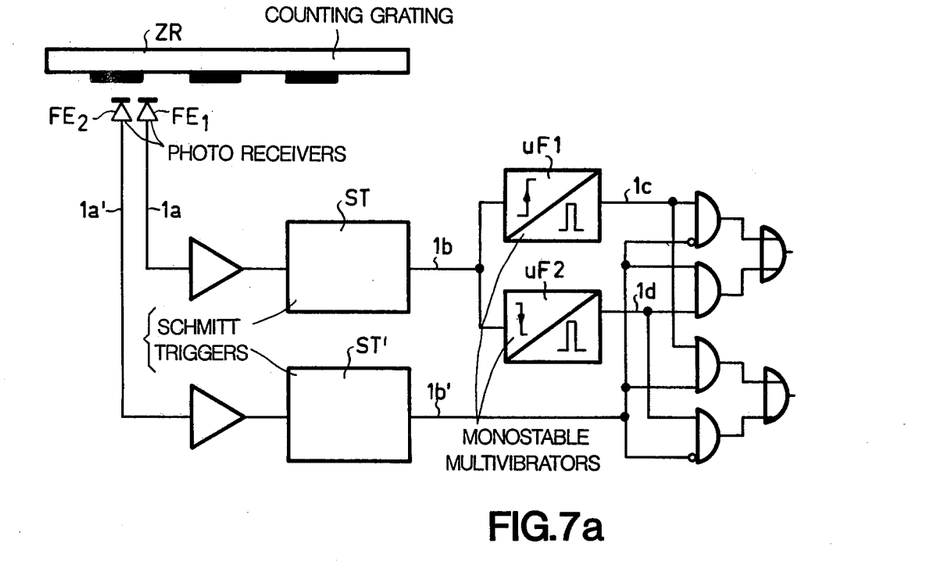
FIGS. 7a, 8a are block diagrams for pulse counting.
Figure 7B:
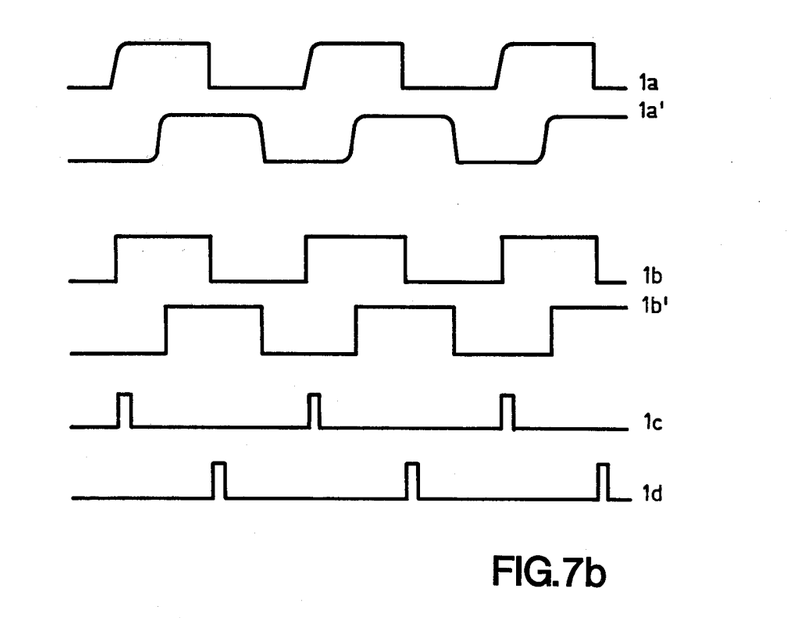
FIGS. 7b, 8b represent the corresponding pulse 30 diagrams.

In accordance with FIG. 7a, the counting grating ZR is scanned with the photo-receivers $FE_1$ and $FE_2$ (photodiodes or phototransistors) for generating count-up or count-down pulses for determining the position during the movement of the storage plate. The photo-receivers receive signals, which are shifted by a quarter grating period relative to each other and produce output signals 1a and 1a' respectively (FIG. 7b). These signals are amplified and shaped into squarewave pulses (1b, 1b') by means of Schmitt-trigger circuits. In the case of a positive edge of 1b (transient from LOW to HIGH) the monostable multivibrator uF1 produces a short pulse 1c; in the case of a negative edge the monostable multivibrator uF1 produces a corresponding pulse 1d. In the case of a movement of the counting grating ZR from left to right 1b is LOW, while the pulse 1c is then produced; in the case of a movement from right to left, however, 1b' is HIGH. By means of a suitable gate circuit the signals 1c, 1d and 1b' may be combined with each other in a way such that count-up or count-down pulses are produced in the edges of 1b in conformity with the direction of movement.

Figure 8A:
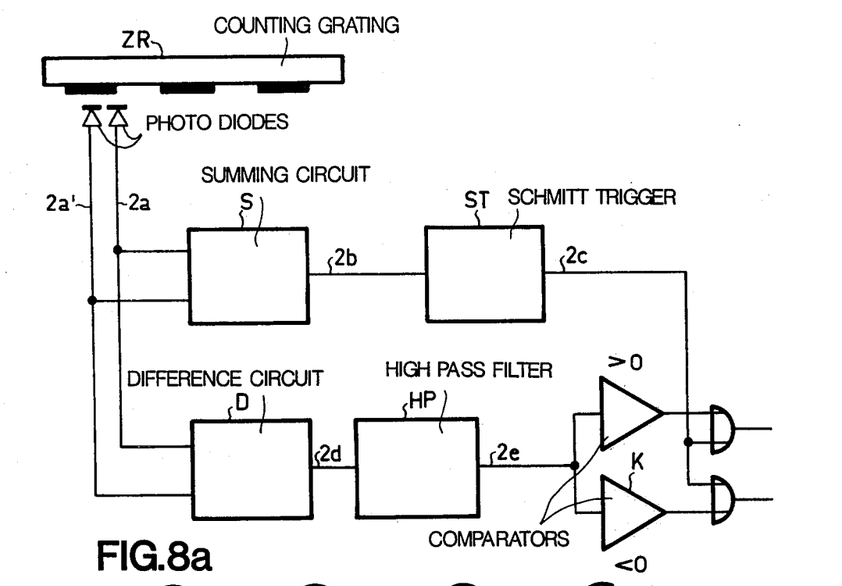
Figure 8B:
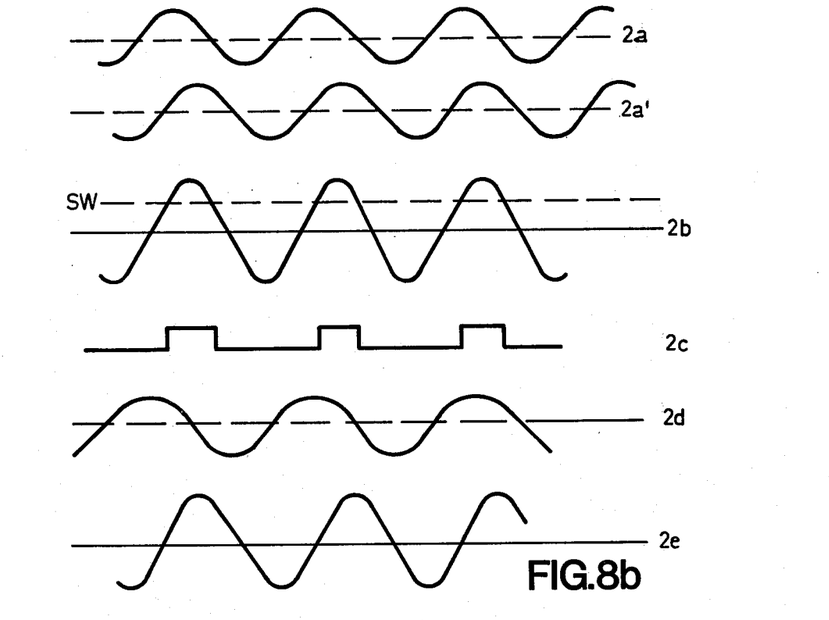

FIG. 8a shows an alternate embodiment in which the signals 2a and 2a' (FIG. 8b) are combined with each other in a summation circuit S and in a difference circuit D. As soon as the sum 2b exceeds a predetermined threshold value SW, the Schmitt trigger ST produced a counting pulse 2c. The difference signal 2d is differentiated in a high-pass RC filter (2e) and is subsequently evaluated by two comparators K. When the differentiated signal is positive during the counting pulse, the movement is performed in the forward direction; however, when it is negative, it is a movement in the backward direction.

In another embodiment, a light source in conjunction with a 2-sector photodiode can be used for determining the movement and counting. The sectors are arranged so that when a grating slit of the grating plate is passed over, first one sector is illuminated with greater intensity, then the two sectors are illuminated with equal intensity, and subsequently the other sector is exposed with greater intensity. The sum signal of the two sectors then yields the counting pulse, whilst the variation in time of the difference signal is indicative of the direction of movement.

The x and y-counts are compared with external input values—the desired addresses. In the case of a deviation a control signal is produced, which, via the power amplifiers LV and LV', controls the moving-coil drives TA and TA' in such a way that the desired position is reached. When the desired position is reached a signal is produced for controlling the electronic write and read system.

In order to reduce the complexity, one of the movements may be performed periodically. For this purpose it is effective to complete the mass of one carrier plate, for example TP2, with a return spring RF so as to obtain a resonant system which oscillates to and fro at its resonant frequency. The corresponding moving-coil drive may then be of less rigid design. Furthermore, the electronic system for determining the direction may be dispensed with, because the direction of movement can be derived from the control signal for the moving coil.

In the case of memories with an extremely high bit density—for example in the case of storage in thin metal films—the positional accuracy attainable with the system described in the foregoing is inadequate, because the write/read system and the address system are physically separated from each other and movements relative to each other in the $\mu$m-range are inevitable. Therefore, in the case of scanning in the x-direction a correction of the y-position is necessary via a control circuit.

Figure 5A:
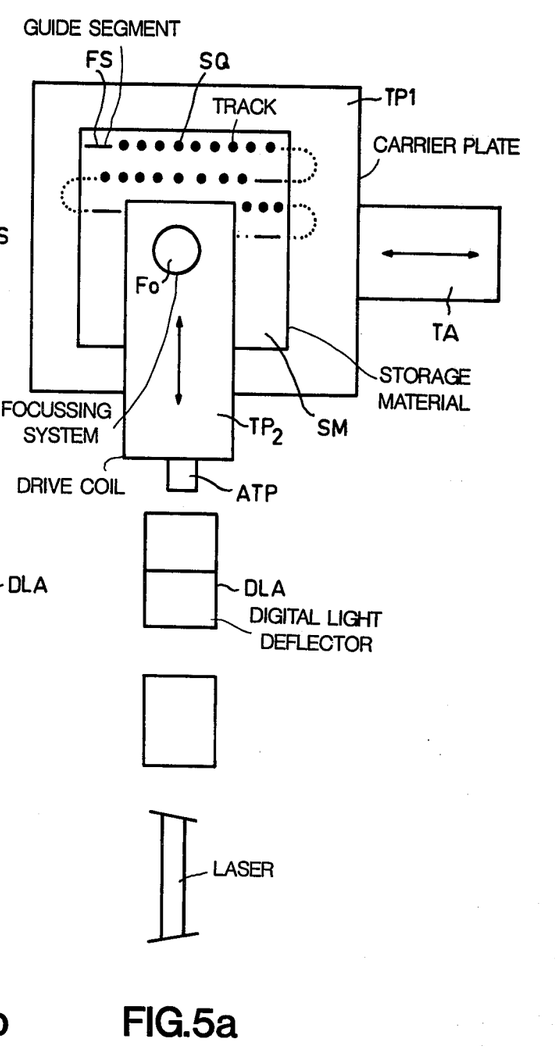
FIGS. 5a and 5b show a schematic plan view and side view of a construction in accordance with the invention which employs the same optical system for writing, reading and positioning.
Figure 5B:
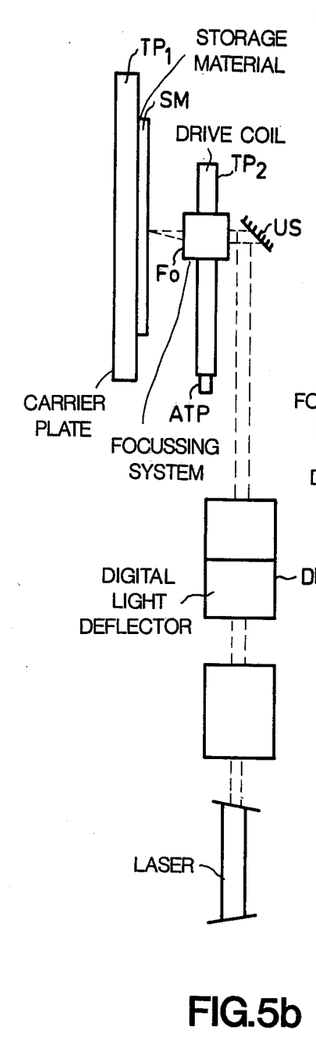

FIGS. 5a and 5b in a schematic plan view and side view show a construction for a method which employs the same optical system for writing, reading and determining the position.

The carrier plate TP1 with the storage material SM oscillates to and fro periodically. During normal operation the carrier plate TP2 with the optical focussing system FO moves in one direction with a constant speed; as a result of this a track SQ is obtained as is indicated in FIG. 5a. For tracking purposes guide segments FS in the form of continuous lines are recorded during writing. With the aid of these guide segments a uniform distance between the tracks is ensured during writing and tracking is ensured during reading. In the case of writing this is achieved in that a fast light deflector stage DLA, which for example in the case of the digital light deflector consists of birefringent calcite prisms and polarization switches, causes the light beam to jump back to the last track written during the guide segment, the exact position being determined by scanning of the guide segment. In the event of deviations from the desired value, the drive TA of TP2 is influenced in such way that the uniform distance is restored.

During reading the exact position is also measured in the guide segments and, as the case may be, corrected.

In order to enable random access during reading, the data blocks between the guide segments FS are characterized by block numbers at the beginning. In the case of random access TP2 is then moved as closely as possible to the desired position; with the aid of the guide segments FS the system locks on to a specific track and reads the block address. If the desired address is not reached, the system approaches the desired track in further decreasing steps.

The memory described herein can also be used for parallel operation. For this purpose the carrier plate TP1 is provided with a plurality of storage surfaces and the carrier plate TP2 with a corresponding number of write/read systems. The address and positioning systems remain unchanged. Parallel operation enables a plurality of bits to be written or read simultaneously for each selected address, so that correspondingly higher overall capacity and higher data rates are obtained.

Figure 6A:
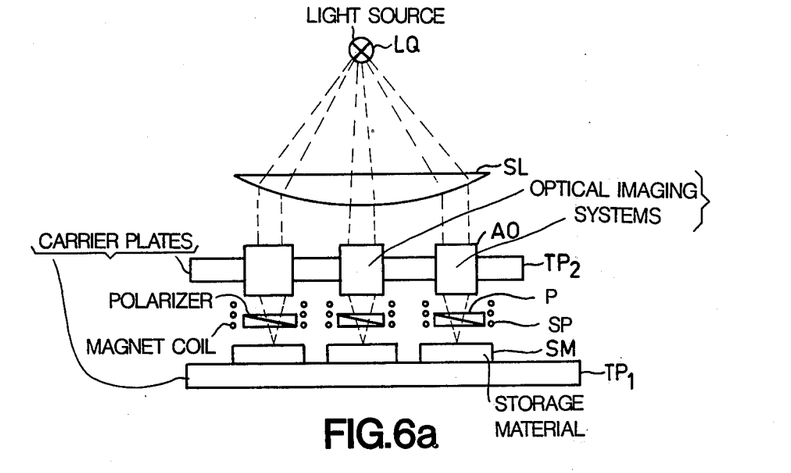
FIG. 6a shows a construction for parallel operation.

For the highly sensitive iron-garnet layers with a photoconductor amplifier layer, common light sources may be employed in addition to separate optical write/read systems in the case of parallel operation. FIG. 6a shows a corresponding construction, which consists of the carrier plate TP1 with the storage material SM, SM' and the carrier plate TP2 with the optical imaging systems AO, AO', the polarizers P, P' and the magnet coils SP and SP' as well as the light source LQ and the collecting lens SL.

The light required for writing and reading is obtained from a light source, for example an incandescent lamp. The collecting lens SL ensures parallel incidence of the light in all optical imaging systems. However, a gas laser, a laser diode or a light-emitting diode may also be used as the light source. The optical imaging system may be a lens moulded from a plastic, a gradient-fiber lens or a holographic lens. The light from the common light source may also be divided among the individual write/read units by a beam splitter consisting of semi-transparent mirrors, or by beam splitting holograms (point holograms). Similarly, birefringent calcite prisms may be employed for the distribution of light over the memory plate.

Figure 6B:
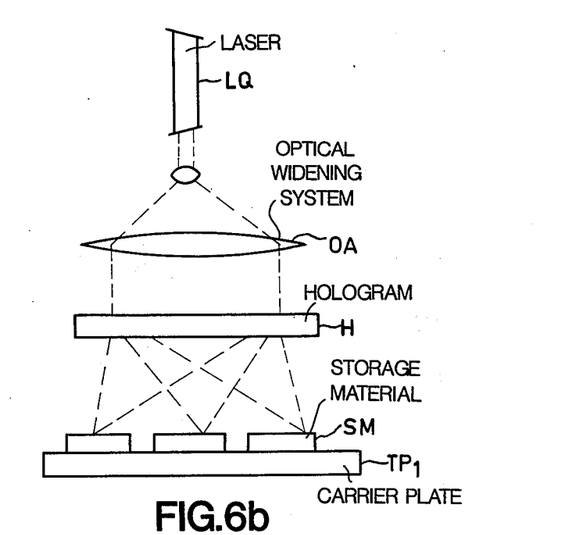
FIG. 6b shows a construction utilizing a hologram.

A plurality of point holograms may be illuminated with the arrangement shown in FIG. 6b. The laser L is a coherent light source, followed by an optical widening system OA and the hologram H. The hologram divides the incident light over a plurality of points. For addressing in the y-direction the hologram H is shifted, so that all image points are shifted jointly.

For optical storage a multitude of storage materials are known, which in principle can all be used in the magneto-mechanical memory. By way of example some embodiments usig special materials are described in more detail hereinafter. For erasable memories for example magneto-optical materials with bit densities of $10^6$ bit/cm$^2$ are available, while, for example, thin metal films with possible bit densities of $10^8$ bit/cm$^2$ are suitable for non-erasable memories.

Known magneto-optical layers such as, for example, manganese-bismuth or iron-garnet layers are suitable for erasable storage. The last-mentioned layers are 2 to 4 $\mu$m thick specially doped layers, which are grown on basic single-crystal substrate. The iron-garnet layer can be magnetized perpendicularly to the plane of the layer. The magnetization disappears as a result of antiferromagnetism / in the so-called compensation temperature range. In this range changing of the internal magnetization condition by means of external fields is not possible. However, a net magnetization is obtained again when the layer is, for example, heated above the compensation point. The magnetization can then be changed by an external magnetic field, which in practice demands a temperature rise by approximately 20° to 30° C. at external field strengths around 100 Oe.

In order to enable a localized magnetization in local point-shaped areas on the layer, the layer is given a specific structure. By means of an etching technology parts of the material are then removed until magnetically isolated islands are left. These islands constitute individual storage cells, in which the magnetization can be aligned parallel or antiparallel to the normal to the layer and which can thus assume two switching states. During operation the storage layer is then maintained at the compensation temperature (in practice within a specific range around the compensation temperature), so that an external magnetic field cannot produce any change. For switching a storage cell it is locally heated for a short time, for example, by a laser beam which is focussed onto it and at the same time an external magnetic field with a desired orientation is applied, which is for example generated by means of a simple coil. The internal magnetization is then aligned in accordance with the external field. Briefly, afterwards the cell has resumed its original temperature and the new switching state is "frozen in". The total switching process then requires only a few microseconds.

For reading out the switching state use is made of the Faraday-offset. In accordance with the prevailing magnetization the polarization plane of incident linearly polarized light is rotated to the right or to the left, viewed in the beam direction. When the layer is disposed between substantially crossed polarizers, this rotation can be coverted into differences in light intensity at the output of the second polarizer.

The luminous energy required for heating (10 mW for 10 $\mu$sec heating time) can be produced by semi-conductor laser diodes. In these lasers the light is emitted by an area of approximately 1 $\mu$m $\times$ 10 $\mu$m in size and by 1:1 imaging it can be focussed on the storage islands which measure approximately 10 $\mu$m c 10 $\mu$m.

It is also possible to obtain an increase of the sensitivity of the above mentioned magneto-optical iron garnet material by a factor of $10^3$ to $10^4$. For this purpose a sandwich structure consisting of: a transparent electrode, a photoconductive layer and a transparent electrode, is deposited on the garnet. When a voltage is applied to the electrodes, a current will flow through the photoconductor upon illumination of an area, thus giving rise to heating. The heat which is produced is diffused in the garnet disposed underneath it, which can then locally be switched by an external magentic field.

The luminous energy of the order of magnitude of some $\mu$W required for switching the photoconductor iron-garnet structure can be produced by light-emitting diodes (LED's). The use of LED's constitutes a very cheap solution. It is also conceivable to employ incandescent lamps. The optical construction corresponds to heat of the basic unit of a write/read system described in the foregoing. Owing to the larger light-emitting area a reduction may be necessary with the aid of the optical imaging system.

As storage material, instead of the garnet layer which has been described in more detail, it is also possible to employ other magneto-optical storage layers, known per se, such as, for example, manganese-bismuth or europium oxide, or amorphous semiconductor layers in the novel memory.

Suitable non-erasable storage layers with a particularly high bit density are for example thin metal films—such as for example Bi-layers having a thickness of approximately 600 Å. By burning holes with the aid of focussed laser light information can be written; the presence of a hole may then correspond to a logic "1" and the absence of a hole to a logic "0". Reading is effected with reduced luminous energy in transmission or in reflection. For hole diameters of 1 $\mu$m the maximum attainable bit density is $10^8$ bits/cm$^2$.

For burning 1 $\mu$m holes in Bi-layers a luminous energy of approximately 10 mW is required with exposure times of approximately 1 $\mu$sec. This energy can be produced by He-Ne lasers, whose radiation can be focussed onto areas with a diameter smaller than 1 $\mu$m owing to the low divergence.

What is claimed is:

1. An apparatus for optical storage or retreival of information comprising a planar memory for storing information in a form which can be read by a beam of radiation, means for supporting said memory for rectilinear movement in a first direction in a first plane generally parallel to the plane of said planar memory, means for producing from a beam of radiation a spot on said memory for writing information on or reading information stored in said memory, means for supporting said producing means for rectilinear movement in a second direction normal to said first direction in a second plane which is spaced from and generally parallel to said first plane, and means for moving said memory and said producing means relative to each other in said first and second directions, respectively, so as to address given locations on said memory by said spot.

2. The apparatus according to claim 1 wherein said moving means includes a moving-coil drive.

3. The memory according to claims 1 or 2 including means coupled to said moving means for controlling the movement of said memory and producing means in said first and second directions so that a specific location on said memory is addressed by said spot in accordance with an address for that location applied to said controlling means.

4. The apparatus according to claim 3 including means for determining the position of said memory and said producing means with respect to each other.

5. The apparatus according to claim 1 wherein said moving means is arranged to periodically move one of said memory and producing means back and forth in a respective one of said first and second directions.

6. The apparatus according to claim 5 including means for controlling the movement of the other of said memory and said producing means in the other of said first and second directions so that a specific location on said memory is addressed by said spot in accordance with an address of that location applied to said controlling means.

7. The apparatus according to claims 5 or 6 wherein said moving means is arranged to move said memory periodically in said first direction and data on said memory are arranged in tracks extending in said first direction, said tracks including guide segments for optically measuring the movement of said producing means in said second direction.

8. The apparatus according to claim 1 or 5 wherein said radiation beam is a light beam and said apparatus includes a light source for producing said light beam and said producing means includes means for focussing said light beam to said spot on said memory and further including means for detecting light coming from said memory which has been modified by the information stored therein.

9. The apparatus according to claim 8 wherein said light source is a laser.

10. The apparatus according to claim 8 wherein said light source is an incandescent lamp.

11. The apparatus according to claim 8 wherein said light source is a light-emitting diode.

12. The apparatus according to claim 8 wherein said focussing means includes a lens molded from plastic.

13. The apparatus according to claim 8 wherein said focussing means includes a gradient-fiber lens.

14. The apparatus according to claim 8 wherein said focussing means includes a holographic lens.

15. The apparatus according to claim 1 wherein said producing means produces a plurality of said spots on said memory, said spots being spaced a predetermined distance from each other so that information can be simultaneously written on or simultaneously read from a plurality of locations on said memory.

16. The apparatus according to claim 15 wherein said radiation beam is a light beam, said apparatus includes a light source for producing said light beam, and said producing means includes means for splitting said light beam into a plurality of secondary beams and means for focussing said plurality of secondary beams to said spots on said memory.

17. The apparatus according to claim 16 wherein said beam splitting means includes a semitransparent mirror.

18. The apparatus according to claim 16 wherein said beam splitting means includes a birefringent calcite prism.

19. The apparatus according to claim 16 wherein said light source is a laser and said beam splitting means includes a beam splitting hologram.

20. The apparatus according to claim 16 wherein said beam splitting means includes a plurality of optical fiber guides.

21. The apparatus according to claim 1 wherein said memory includes a magneto-optical material disposed between crossed polarizing sheets.

22. The apparatus according to claim 21 wherein said magneto-optical material comprises iron-garnet.

23. The apparatus according to claim 21 wherein said material comprises manganese-bismuth.

24. The apparatus according to claim 1 wherein said memory comprises a magneto-optical photoconductor sandwich.

25. The apparatus according to claim 1 wherein said memory comprises a non-erasable thin metal film.

26. The apparatus according to claim 1 wherein said memory comprises photographic layers.

27. An apparatus for optical storage or retrieval of information comprising a memory for storing information in a form which can be read by a beam of radiation, means for producing from a beam of radiation a spot on said memory for reading said information stored therein or for writing information thereon, means for supporting said memory and said spot producing means for movement relative to each other so that given locations on said memory can be addressed by said spot, and means for determining the position of said memory relative to said spot producing means, said determining means including two optical gratings oriented perpendicular to each other, said gratings being coupled to said memory for movement therewith, and means for detecting variations in the brightness of light passing through said gratings upon movement thereof and generating therefrom pulses representative of the distance moved.

28. The apparatus according to claim 27 wherein said memory is planar, said planar memory is supported by said supporting means for movement in a first direction in the plane of said planar memory and said producing means is supported by said supporting means for movement in a second direction normal to said first direction in a plane parallel to the plane of said planar memory.

29. The apparatus according to claims 27 or 28 including means for determining the direction of relative movement between said memory and said spot producing means.

30. The apparatus according to claim 29 wherein said direction determining means includes two photoelectric cells spaced a quarter of the grating spacing from each other for producing direction depending phase-shifted counting pulses.

31. The apparatus according to claim 29 wherein said direction determining means includes a pair of photodiodes each having two sectors for measuring time variations of a difference signal.

* * * * *